US012660119B2

(12) United States Patent
Vadillo et al.

(10) Patent No.: US 12,660,119 B2
(45) Date of Patent: Jun. 16, 2026

(54) IONIC WIND GENERATOR

(71) Applicant: Ventiva, Inc., San Jose, CA (US)

(72) Inventors: Rudy Vadillo, Gilroy, CA (US); Gary Oliverio, San Jose, CA (US); Himanshu Pokharna, Saratoga, CA (US); Carl Schlachte, Ben Lomond, CA (US)

(73) Assignee: Ventiva, Inc., Fremont, CA (US)

( * ) Notice: Subject to any disclaimer, the term of this patent is extended or adjusted under 35 U.S.C. 154(b) by 908 days.

(21) Appl. No.: 17/607,154

(22) PCT Filed: Apr. 29, 2020

(86) PCT No.: PCT/US2020/030397
§ 371 (c)(1),
(2) Date: Oct. 28, 2021

(87) PCT Pub. No.: WO2020/223300
PCT Pub. Date: Nov. 5, 2020

(65) Prior Publication Data
US 2022/0210945 A1 Jun. 30, 2022

Related U.S. Application Data

(60) Provisional application No. 62/882,928, filed on Aug. 5, 2019, provisional application No. 62/840,332, filed on Apr. 29, 2019.

(51) Int. Cl.
*H01T 23/00* (2006.01)
*B03C 3/017* (2006.01)
(Continued)

(52) U.S. Cl.
CPC ......... *H05K 7/20172* (2013.01); *B03C 3/017* (2013.01); *B03C 3/41* (2013.01);
(Continued)

(58) Field of Classification Search
CPC ............. H05K 7/20172; H05K 3/3436; H05K 7/20181; B03C 3/41; B03C 3/017
(Continued)

(56) References Cited

U.S. PATENT DOCUMENTS 5,210,940 A 5/1993 Kawakami et al.
6,900,077 B2 5/2005 Akram
(Continued)

OTHER PUBLICATIONS

International Search Report and Written Opinion from the ISA/US from corresponding PCT application, Sep. 11, 2020.

*Primary Examiner* — Crystal L Hammond
*Assistant Examiner* — Lucy M Thomas
(74) *Attorney, Agent, or Firm* — Wilson Sonsini Goodrich & Rosati

(57) ABSTRACT

The present invention is a directed to an integrated ionic air mover that provides air flow rates through an opening within the a printed circuit board (PCB), or other similar insulating surface, to create the structure of the air mover, so that high heat generating components mounted on the PCB can be cooled. The ionic air mover has sharp and blunt electrodes with a corona discharge taking place in the air gap in between the electrodes. A directional emission of the ions creates an ionic wind the moves air through the PCB. The invention provides a low-cost structure, while achieving high electro-air flow power conversion efficiency and air-flow performance integrated into the PCB that the heat generating components are mounted on. The ionic air mover may also be surface mounted to a PCB and include a transmittal coil for wireless charging.

35 Claims, 9 Drawing Sheets

(51) Int. Cl.

| | | |
|---|---|---|
| *B03C 3/41* | (2006.01) | |
| *H05K 3/341* | (2026.01) | |
| *H05K 7/20* | (2006.01) | |

(52) U.S. Cl.
CPC ....... *H05K 3/3436* (2013.01); *H05K 7/20181* (2013.01); *B03C 2201/04* (2013.01)

(58) Field of Classification Search
USPC ......................................................... 361/230
See application file for complete search history.

(56) References Cited

U.S. PATENT DOCUMENTS

| | | | |
|---|---|---|---|
| 10,978,881 B2 | 4/2021 | Schlachte et al. | |
| 2002/0075655 A1 | 6/2002 | Chen et al. | |
| 2009/0195983 A1 | 8/2009 | Reichert et al. | |
| 2010/0177519 A1 | 7/2010 | Schlitz | |
| 2011/0292560 A1* | 12/2011 | Jewell-Larsen .... | H05K 7/20172 |
| | | | 361/231 |
| 2012/0007742 A1 | 1/2012 | Gooch et al. | |
| 2012/0008249 A1 | 1/2012 | Sawyer et al. | |
| 2012/0120542 A1* | 5/2012 | Zhang ................ | H05K 7/20172 |
| | | | 361/230 |
| 2012/0121487 A1 | 5/2012 | Jewell-Larsen et al. | |
| 2012/0162903 A1 | 6/2012 | MacDonald et al. | |
| 2013/0271990 A1 | 10/2013 | Hussell et al. | |
| 2017/0170688 A1* | 6/2017 | Maniktala ............... | H01F 38/14 |
| 2018/0206362 A1 | 7/2018 | Vadillo et al. | |
| 2019/0052104 A1 | 2/2019 | Schlachte et al. | |

* cited by examiner

IONIC WIND GENERATOR

CROSS-REFERENCE TO RELATED APPLICATIONS

This Application is a National Stage Application under § 371 of International Application No. PCT/US20/30397, filed Apr. 29, 2020, which claims benefit of U.S. Provisional Patent Application No. 62/840,332, filed Apr. 29, 2019, and U.S. Provisional Patent Application No. 62/882,928, filed Aug. 5, 2019, the contents of each are incorporated by reference in their entireties.

FIELD OF THE DISCLOSURE

The present invention relates to an ionic wind generator, and more specifically, to an ionic wind generator integrated within a printed circuit board.

BACKGROUND OF THE INVENTION

It is well known that heat can be a problem in many electronic device environments, and that overheating can lead to failure of components such as integrated circuits and other electronic components. Most electronics devices, including smartphones, wireless chargers, computers, and entertainment devices, implement some form of thermal management to remove excess heat.

Heat sinks are a common passive tool used for thermal management. Heat sinks use conduction and convection to dissipate heat and thermally manage the heat producing components. To increase the heat dissipation of a heat sink, a conventional rotary fan or blower fan has been used to move air across the surface of the heat sink, referred to generally as forced convection. However, conventional fans are often large, noisy, increase the weight of the electronic device, and may have reliability issues due to the failure of moving parts and bearings.

A solid-state ionic wind air mover addresses the disadvantages of conventional fans. However, providing an ion wind fan that meets the requirements of consumer electronic devices presents numerous challenges not addressed by currently existing ionic wind devices.

An electrostatic or ionic fan comprises one or more sharp (corona) and blunt (neutralizing) electrodes. The sharp electrode may also be referred to as an emitter whereas the blunt electrode may be referred to as a collector. When an electric field is applied between the two electrodes, this causes a partial breakdown of the gas (i.e. air) between the emitter and collector. This partial breakdown is referred to as a corona discharge, which occurs near the emitter. This discharge produces ions that are attracted to the neutralizing collector. En route, the ions collide with neutral air molecules creating a pressure head resulting in an air flow similar to that produced by a mechanical fan, however without any moving fan parts, such as fan blades.

Ionic fans have previously been described. For example, U.S. patent application Ser. No. 15/864,676 to Vadillo et al., entitled, "Apparatus and method for removing heat from a heat-generating device," discloses a portable electronic device that uses an ionic wind generator. U.S. patent application Ser. No. 15/673,060 to Schlachte et al., entitled, "Charging apparatus and method," discloses a charging device that includes an ionic wind generator used in a charging assembly for imparting a charge on a mobile device. U.S. patent Ser. No. 13/014,513, entitled, "consumer electronics device having replaceable ion wind fan," discloses a consumer electronic device that can be managed by using forced convection via an ionic wind fan. All patents, patent applications, and non-patent literature cited are hereby incorporated by reference in their entireties, for all purposes.

Still, there remains a continuing need for improved cooling systems for electronic devices.

BRIEF SUMMARY OF THE PRESENT INVENTION

The present invention produces air flow utilizing ions in a gas with an electric DC current based corona. Corona generation requires partial ionization of the air. Other air movers use this principle, but they rely upon a stainless-steel structure, or an insert molding to create the emitter-collector structure. According to the present invention there is provided an air mover directly integrated on the PCB to create air flow specifically where it is needed, rather than in a discreet component, which may have to be mounted in a location some distance from the heat generating components due to PCB real-estate limitations. Moreover, the present invention provides a highly scalable solution and can be integrated with the automated electronic board assembly process.

Embodiments of an ionic air mover can be constructed to perform particular operations or actions by virtue of having software, firmware, hardware, or a combination of them installed, that in operation causes or cause the ionic air mover to perform actions. One or more computer programs can be configured to perform particular operations or actions by virtue of including instructions that, when executed by data processing apparatus, cause the ionic air mover to perform the actions.

One general aspect includes an integrated ionic air mover having a printed circuit board (PCB) for mounting electronic components. The PCB includes a first side and a second side, and a PCB opening traversing from the first side to the second side of the PCB. The PCB opening for allowing air to pass through the PCB. The PCB opening is characterized as having a length, a width, and a height. The integrated ionic air mover also includes an emitter mounted on the first side of the PCB, the emitter positioned across the PCB opening on the first side of the PCB and a collector mounted on the second side of the PCB, the collector positioned across the PCB opening on the second side of the PCB. The collector and emitter are mounted on opposite sides of the PCB. The emitter and the collector are oriented such that when a sufficient differential voltage is applied to the emitter and the collector, air is ionized to produce an airflow through the PCB opening. The airflow cools electronic components mounted on or near the PCB. Other embodiments of this aspect include corresponding computer systems, apparatus, and computer programs recorded on one or more computer storage devices.

Another general aspect includes a printed circuit board (PCB) mounted ionic air mover. The PCB mounted ionic air mover includes an ionic air mover assembly for mounting over a PCB opening on a PCB. The assembly includes a first side and a second side, and an assembly opening characterized as having a length, a width, and a height. The assembly opening traverses from the first side to the second side of the ionic air mover assembly. The assembly opening sized to allow air to pass through the assembly opening from the first side to the second side. The PCB mounted ionic air mover also includes an emitter mounted on the first side of the assembly. The emitter is positioned across the assembly opening on the first side. The PCB mounted ionic air mover also includes a collector mounted on the second side of the assembly. The collector is positioned across the assembly opening on the second side of the assembly. The PCB mounted ionic air mover also includes a PCB attachment member affixed to at least one of the first side and the second side of the assembly. The emitter and the collector are oriented such that when a sufficient differential voltage is applied to the emitter and the collector, air is ionized to produce an airflow through the assembly opening from the first side to the second side. The airflow is capable of passing through an opening in the underlying PCB, thereby cooling electronic components mounted in proximity to the assembly. Other embodiments of this aspect include corresponding computer systems, apparatus, and computer programs recorded on one or more computer storage devices.

Another general aspect includes a method of manufacturing an integrated ionic air mover on a printed circuit board (PCB), and may include the steps of: a) providing an insulative substrate, b) forming a printed circuit on a printed circuit surface of the insulative substrate to form a PCB having a first side and a second side, c) forming a PCB opening on the PCB, the PCB opening traversing from the first side to the second side, d) forming an emitter mounted on the first side of the PCB, the emitter positioned across the PCB opening on the first side of the PCB, and e) forming a collector mounted on the second side of the PCB, the collector positioned across the PCB opening on the second side of the PCB.

Another general aspect includes a method of manufacturing a printed circuit board (PCB) surface mounted ionic air mover may include the steps of: a) providing an insulative substrate; b) forming a printed circuit on a printed circuit surface of the insulative substrate to form a PCB having a first side and second side, c) forming a PCB opening on the PCB, the PCB opening traversing from the first side to the second side, forming an ionic air mover assembly for mounting over the PCB opening, the assembly having a first side, a second side, and an assembly opening, e) forming an emitter mounted on the first side of the assembly, the emitter positioned across the assembly opening on the first side of the assembly, g) forming a collector mounted on the second side of the assembly, the collector positioned across the assembly opening on the second side of the assembly, g) aligning the PCB opening with assembly opening, and h) affixing the assembly to the PCB.

Another general aspect includes a self-cooling wireless charging apparatus. The self-cooling wireless charging apparatus includes a housing and a cradle operable to receive a wirelessly chargeable device. The apparatus also includes a printed circuit board (PCB) having a first side and a second side, and a PCB opening traversing from the first side to the second side of the PCB. The PCB opening is sized to allow air to pass through the PCB. The PCB opening is characterized as having a length, a width, and a height. The apparatus also includes a transmitter coil mounted on one side of the PCB. The transmitter coil is operable to generate a magnetic flux for charging the wirelessly chargeable device mounted in the cradle. The transmitter coil has a transmitter coil aperture positioned near a center of the transmitter coil, and the transmitter coil aperture is substantially aligned with the PCB opening. The apparatus also includes an ionic air mover substantially aligned with the PCB opening. The ionic air mover has at least one emitter and at least one collector spaced apart such that when a differential voltage is applied to the at least one emitter, ionized air moves from the at least one emitter towards the at least one collector, thereby generating an airflow for drawing air through the PCB opening to cool the transmitter coil. Other embodiments of this aspect include corresponding computer systems, apparatus, and computer programs.

Elements disclosed as being part of a particular general aspect or embodiment should not be taken to be limited that particular general aspect or embodiment. Rather, any elements described for use in one particular embodiment may be incorporated into any other embodiment. In addition, the general aspects described may provide for working embodiments without every disclosed limitation.

DETAILED DESCRIPTION OF EMBODIMENTS

Figure 1:
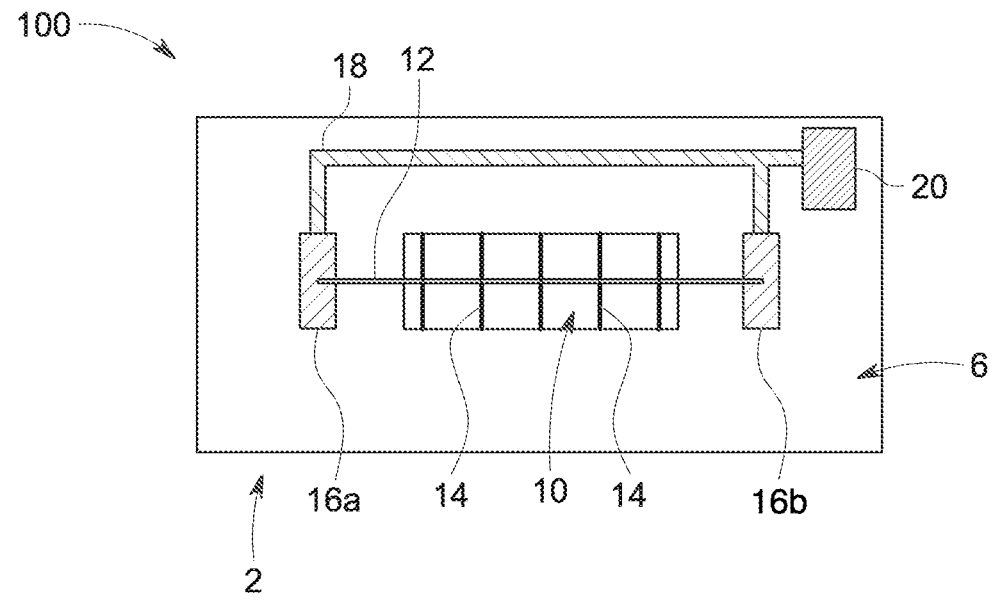
FIG. 1 is a top view of an integrated ionic air mover.

The invention now will be described more fully hereinafter with reference to the accompanying drawings, in which embodiments of the invention are shown. This invention may however be embodied in many different forms and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. As used herein, the term "and/or" includes any and all combinations of one or more of the associated listed items.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section.

It will be understood that the elements, components, regions, layers and sections depicted in the figures are not necessarily drawn to scale.

The terminology used herein is for the purpose of describing particular embodiments only, and is not intended to be limiting of the invention. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom," "upper" or "top," "left" or "right," "above" or "below," "front" or "rear," may be used herein to describe one element's relationship to another element as illustrated in the Figures. It will be understood that relative terms are intended to encompass different orientations of the device in addition to the orientation depicted in the Figures.

Unless otherwise defined, all terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. The invention illustratively disclosed herein suitably may be practiced in the absence of any elements that are not specifically disclosed herein. The integrated ionic air movers in the embodiments described below are built into the same PCB that houses the circuit elements that require cooling, or are built into a separate PCB that can be located within the system. This creates an air mover directly on the PCB directly where it is needed, in order to dissipate heat from heat generation components such as processors, memory, radios, etc., which require cooling. Moreover, the location of the ionic air movers can be factored into the design of the PCB, knowing where the heat generating components will be located. The construction and/or materials of the board can be any type of circuit board, but preferably use technology that is widely available and sources from manufacturers worldwide based on Flame Retardant-4 (FR-4) based PCBs. By using FR-4 based PCBs, it allows user to easily manufacture the integrated ionic air mover by leveraging worldwide preexisting FR-4 manufacturing infrastructure to create the integrated ionic air mover.

Figure 2:
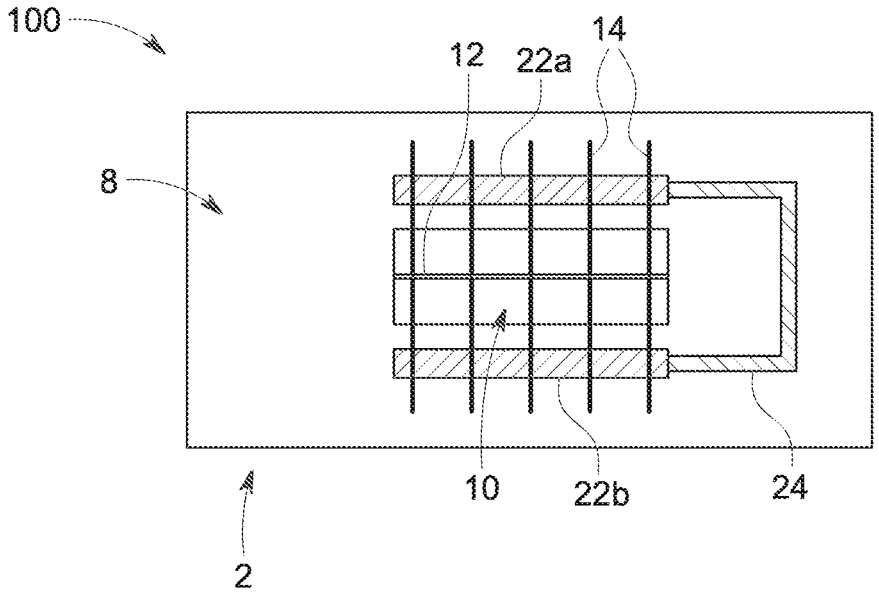
FIG. 2 is a bottom view of the integrated ionic air mover of FIG. 1.

Turning to FIGS. 1 and 2, an embodiment of an integrated ionic air mover 100 is shown from the top (FIG. 1) and bottom (FIG. 2). The integrated ionic air mover 100 is constructed to be integrated with a printed circuit board (PCB) 2. The PCB has a top side 6 and a bottom side 8. Mounted on the top side 6 is an emitter 12. The PCB 2 has a PCB opening 10 that traverses from the first side 6 to the second side 8 of the PCB 2.

On the second side of the PCB 2 is the collector 14. In the embodiments shown in FIGS. 1 and 2, the emitter 12 and collector 14 are coplanar with each other and on opposites sides of the PCB 2. The emitter 12 and collector 14 are also consistently spaced from each other to produce a corona discharge, thereby ionizing air between the emitter 12 and collector 14 and causing an airflow. In typical embodiments, the emitter 12 acts as the anode and the collector 14 acts as the cathode in the ionic air mover circuit. As shown in FIGS. 1 and 2, both the emitter and the collector span the entirety of the length of the PCB opening 10. The emitter 12 and collector 14 are oriented such that when a sufficient differential voltage is applied to the emitter 12 and collector 14, air is ionized to produce an airflow through the PCB opening 10, thereby cooling electronic components 4 (shown in FIG. 4 through FIG. 11) that are located on or near the PCB 2. The PCB opening 10 has a length, a width, and height that can be optimized to create maximum airflow through the PCB opening 10 to cool electronic components 4.

The emitter 12 and collector 14 may both have a longitudinal axis that are substantially perpendicular to each other, and coplanar with each other and consistently spaced from each other in order to produce a corona discharge that leads to maximum airflow through the PCB opening 10.

While shown in FIGS. 1 and 2 as a single wire, the emitter 12 may be a plurality of emitting wires. The collector 14 is shown as a plurality of collector wires 14. The collector may also be in the shape of a mesh (not shown) or a plate made out of a conductive material, such as stainless-steel comprising a plurality of relative thin wires in a direction that is perpendicular to the emitter wire.

In preferred embodiments, the plurality of collector wires 14 has a cross-sectional diameter between 0.1 mm and 2.0 mm. In other preferred embodiments, the collector wires have a diameter between 0.5 mm and 1.0 mm, and in still further preferred embodiments, the plurality of collector wires 14 have a diameter of at least 0.5 mm. Plurality of collector wires 14 are free of sharp edges, burrs, or other mechanical defects in proximity to the emitter 12. Mechanical defects may lead to excessive electric field gradients, which in turn can result in an electric-air breakdown, causing an arc, which may have a destructive effect. The lack of sharp edges on the collector near the emitter reduces arcing where there is an electric field present between the emitter 12 and collector 14. One way to reduce sharp edges is to have the cross section of the emitter 12 and/or collector be elliptical in shape or circular in shape. In preferred embodiments, the collector wire has a cross-sectional diameter larger than the diameter of the emitter 12 and is made of stainless-steel.

In preferred embodiments, the emitter 12 is a wire having a diameter between 20 microns and 100 microns.

Referring to FIG. 1, the PCB has a first conductive end plate 16a and a second conductive end plate 16b. The ends plates 16a, 16b are positioned on opposites sides of the PCB opening 10, but on the same side of the PCB 2. The emitter 12 connects the two conductive end plates 16a, 16b along the length of the PCB opening 10. A PCB wire 18 connects the first and second end plates 16a, 16b to each other long the PCB. Instead of a wire 18, the first and second end plates 16a, 16b may be a conductive layer within the PCB. The wire 18 or layer is capable of carrying positive direct current (DC) bias. The emitter end plates 16a, 16b and collector plates 22a, 22b may be soldered to the PCB 2 for permanent attachment.

To power the emitter, a power supply 20 is electrically connected to the PCB wire 18 or PCB layer. The power supply 20 is capable of providing a high voltage power supply and current to the emitter. The high voltage may be several hundred to several thousand volts DC. The DC high voltage can be generated in any number of ways readily understood by those skill in the art. For example, one may use a diode and a capacitor pump circuit to increase the DC voltage. Another way may comprise using a transformer-based circuit to achieve a high AC voltage prior to converting to a DC voltage.

The integrated ionic air mover 100 may also include a controller (not shown) for monitoring the temperature of electronic components 4 on the PCB 2. The controller is capable of turning on or off the ionic air mover 100 when a threshold temperature has been detected. For example, the ionic air mover 100 will turn on when a specific high temperature has been reached, and will turn off when the measured electronic components 4 reach below a specific low temperature. The controller may cause a voltage to increase to a value that generates a controlled arc for cleaning either the emitter 12 or controller 14 upon detecting a predetermined threshold of the monitored characteristic.

Opposite to the first side 6 of the PCB 2, on the second side 8 is the collector 14 that has a collector first plate 22a, and collector second plate 22b on opposing ends of the PCB opening, but on the same side of the PCB 2. The collector end plates 22a, 22b are connected to each other via a ground wire 24.

Figure 3:
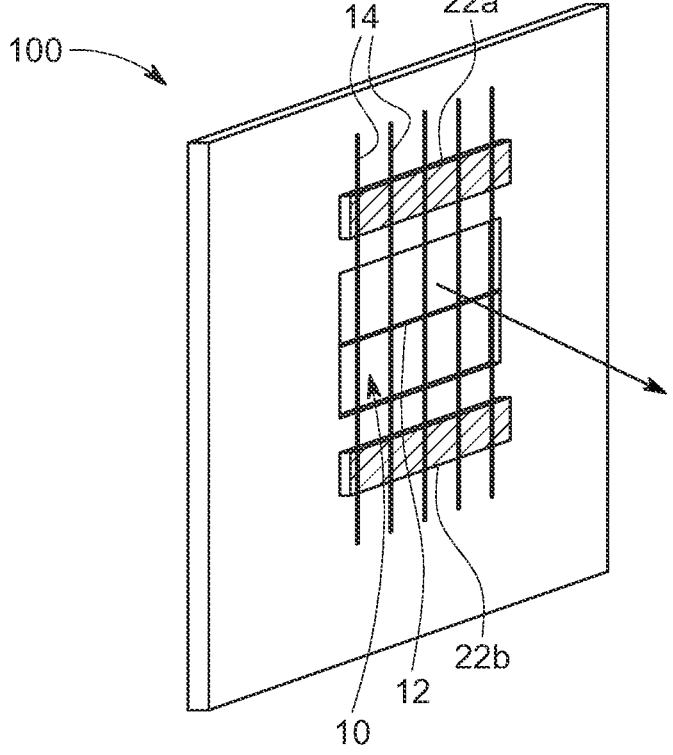
FIG. 3 is a perspective view of an integrated ionic air mover.

Turning to FIG. 3, FIG. 3 shows parts of the integrated ionic air mover in perspective view showing a directional arrow for that of airflow through the PCB opening 10.

By integrating the ionic air mover 100 on a PCB 2, it is possible to co-locate the power supply 20 circuitry with the emitter 12 and collector 14 structures on the PCB 2. The PCB may be made from an insulative substrate, and have any number of metallic layers, thereby allowing a direct connection to the power supply 20 terminals and further eliminating mechanical interconnections which may present possible points of failure.

Alternatively, the power supply may be a smart power supply, that is, it may incorporate a microprocessor 20 (not shown). The microprocess may perform various tasks, such as adjusting the voltage (and corresponding air flow from ionic air mover 100, as the generated air flow is a function of voltage and current) based in response to a measured predetermined characteristic. Measured characteristics include, but are not limited to temperature, impedance, detection of electrical short, and duration of operation. The microprocessor may also control the high voltage generation of the power supply 20, or provide feedback control of the power supply 20, such as, for example, incorporating a feature to shut the power supply down in case of an electric short or other detected failure. In addition to such safety mechanisms, the microprocessor may also keep track of the number of hours the air mover has been active and take any preventative or corrective action to maintain the operation health of the device.

The microprocessor controlled smart power supply can also monitor the impedance of the system and can detect the buildup of contaminants such as $SiO_2$, which can often form as a deposit on the emitter. If such contaminants are detected the power supply can run a "clean cycle." The clean cycle may include temporarily raising the voltage to be higher than the breakdown voltage for the air gap. This creates a temporary arc that has sufficient energy to break down $SiO_2$ dendritic deposits and clean the emitter 12, ensuring long term operation of the air mover.

Figure 4:
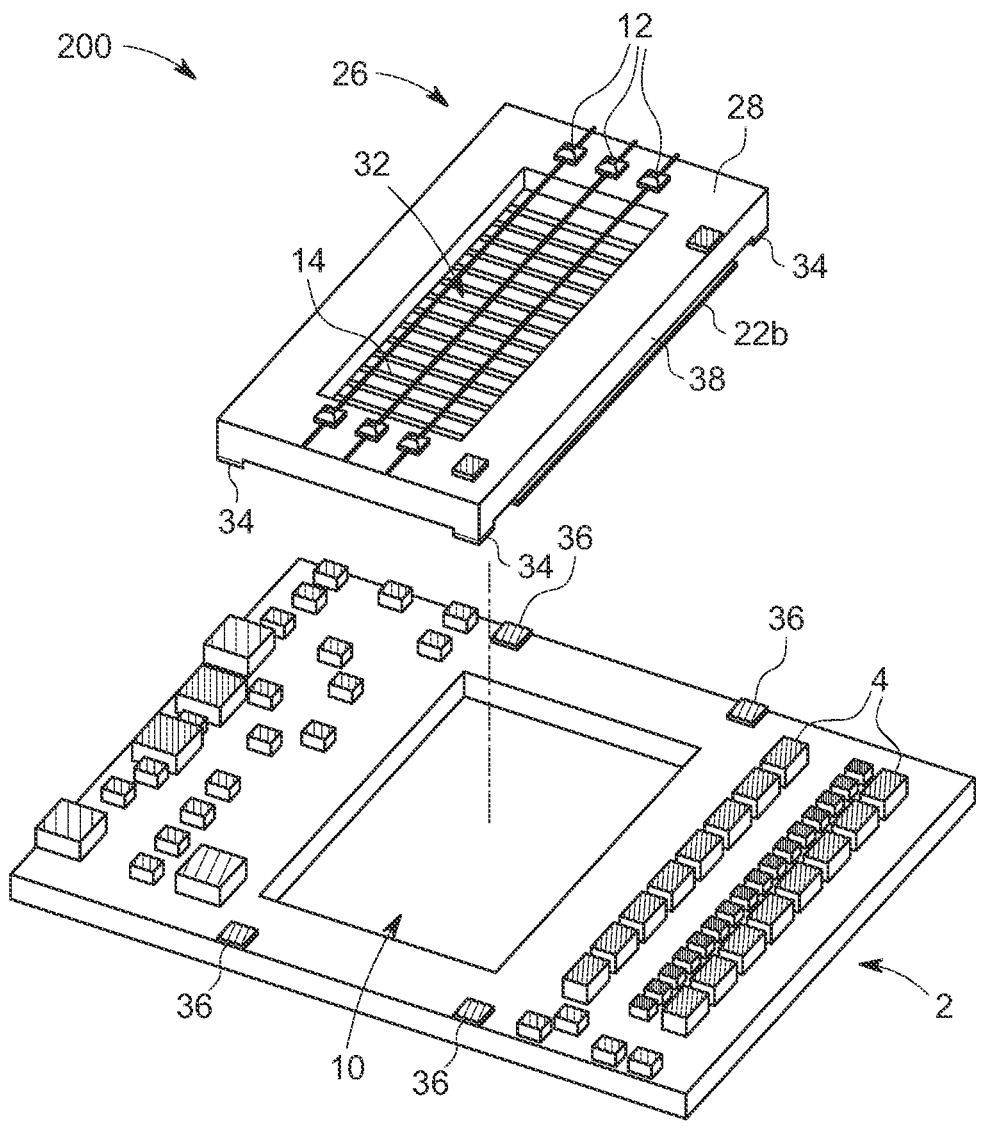
FIG. 4 is an exploded view of a PCB surfaced mounted ionic air mover.
Figure 5:
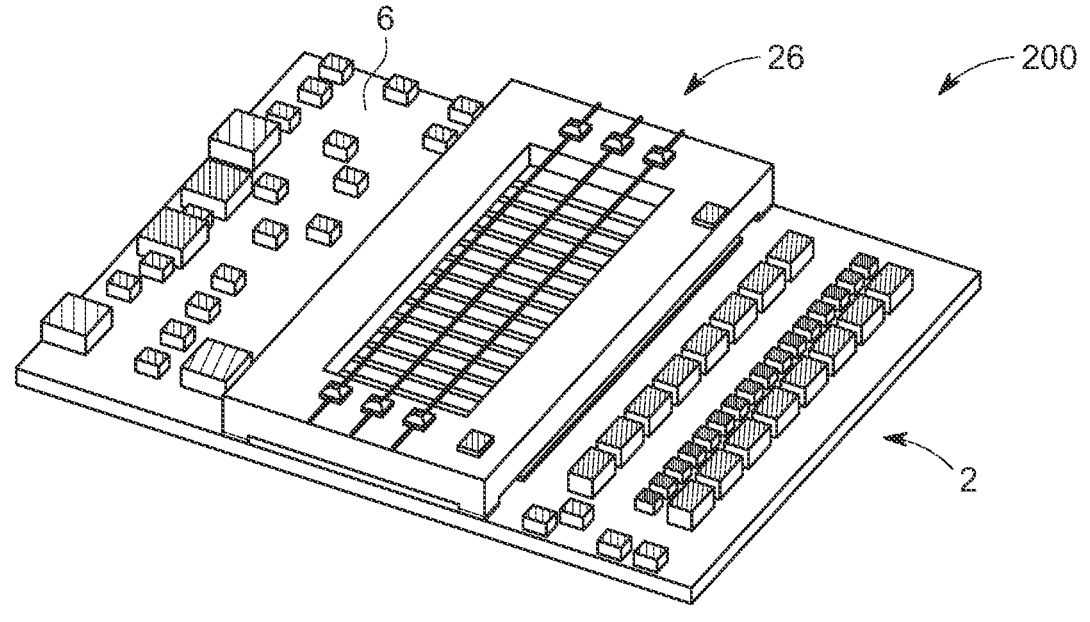
FIG. 5 is a top perspective view of an assembled PCB surface mounted ionic air mover of FIG. 4.
Figure 6:
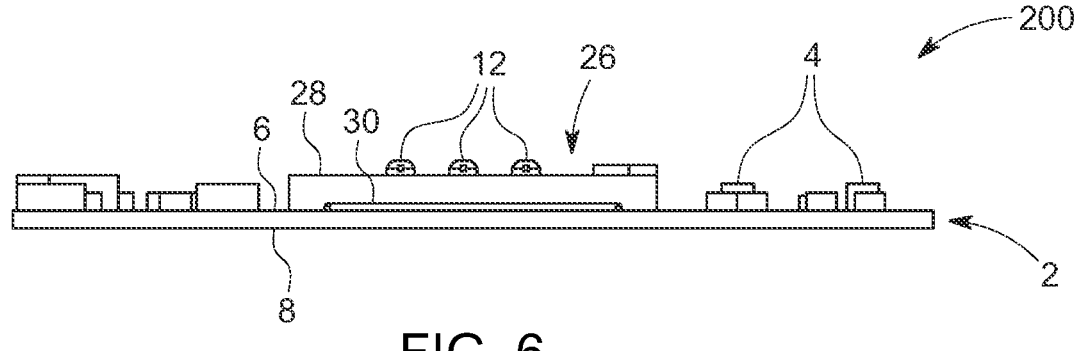
FIG. 6 is a side view of the assembled PCB mounted ionic air mover of FIG. 5.

Turning to FIGS. 4-6, a PCB surface mounted ionic air mover 200 will be described. In contrast to the embodiments described in FIGS. 1-3, where the emitter 12 and collector 14 are integrated with the PCB, in FIGS. 4-6 an ionic air mover assembly 26 is mounted to the surface of a PCB 2. The ionic air mover assembly 26 has a top side 28, a bottom side 30, and outer edges 38. As described above with the integrated ionic air mover 100 of FIGS. 1-3, here the ionic air mover assembly 26 has an emitter 12 on the top side 28, and collector 14 on the bottom side 30. One can envision that the emitter 12 and collector 14 may be placed on opposite sides of the assembly 26 without detracting from the spirit of the invention.

The ionic air mover assembly 26 has an assembly opening 32 that has a length, a width, and height that can be optimized to create the type and magnitude of air flow desired. The emitter 12 is mounted on the first side 28 of the assembly over the assembly opening 32. The collector is mounted on the second side 30 of the assembly 26 and positioned across the assembly opening 32 on the second side 30 of the assembly 26. The assembly opening 32 traverses from the first side 28 to the second side 30 of the assembly 26. The assembly 26 is placed on a top side 6 of the PCB 2 that has a PCB opening 10, and positioned so that the assembly opening 32 and PCB opening 10 are substantially aligned so that air flow can pass from the assembly opening 32 through the assembly 26 and through the PCB opening 10. A substantial alignment is an alignment such that air can flow in a fairly unimpeded manner from the PCB opening 10 through the assembly opening 32. This may be a 100% alignment, at least a 90% alignment, at least an 80% alignment, at least an 70%, at least a 60% alignment, or other value that accomplishes the purpose of air flow through both the assembly opening 30 and PCB opening 10. As described above, the air flow is created by a corona discharge created when applying a differential voltage between the emitter 12 and collector 14.

To attach the assembly 26 to the PCB 2, one, two, three, four or more PCB attachment members are located on the assembly 26, preferably in proximity to the outer edges 38 of the assembly 26. These may be solder pads 34 so that a user can affix the assembly 26 to the PCB 2. In some embodiments, assembly attachment members 36 may be located on the PCB 2, to affix the assembly to the PCB 2.

The embodiments may take a variety of shapes and forms. As shown, the PCB 2 and assembly 26 are rectangular shaped, but any number of shapes may be used without detracting from the spirit of the invention. The size and shape of the assembly opening 32 and PCB opening 10 are sized and shaped to substantially align with each other.

In some embodiments, an ozone catalyst member (shown in FIGS. 7-11) may be included to reduce (i.e. mitigate) the amount of ozone produced by corona discharge. While ozone may be useful to decontaminate objects, ozone is often undesirable due to its noticeable smell, even at very low quantities. Accordingly, an ozone catalyst member 44 could be mounted in a variety of locations. An example such an ozone catalyst member is a member comprising manganese oxide, which may be coated on a mesh, or perforated metallic or organic sheet, or any similar structure what will allow the air flow to pass through it. Alternatively, no catalyst may be used in order to take advantage of the disinfecting properties of the ozone generated in order to disinfect a chargeable device such as a cell phone.

Figure 7:
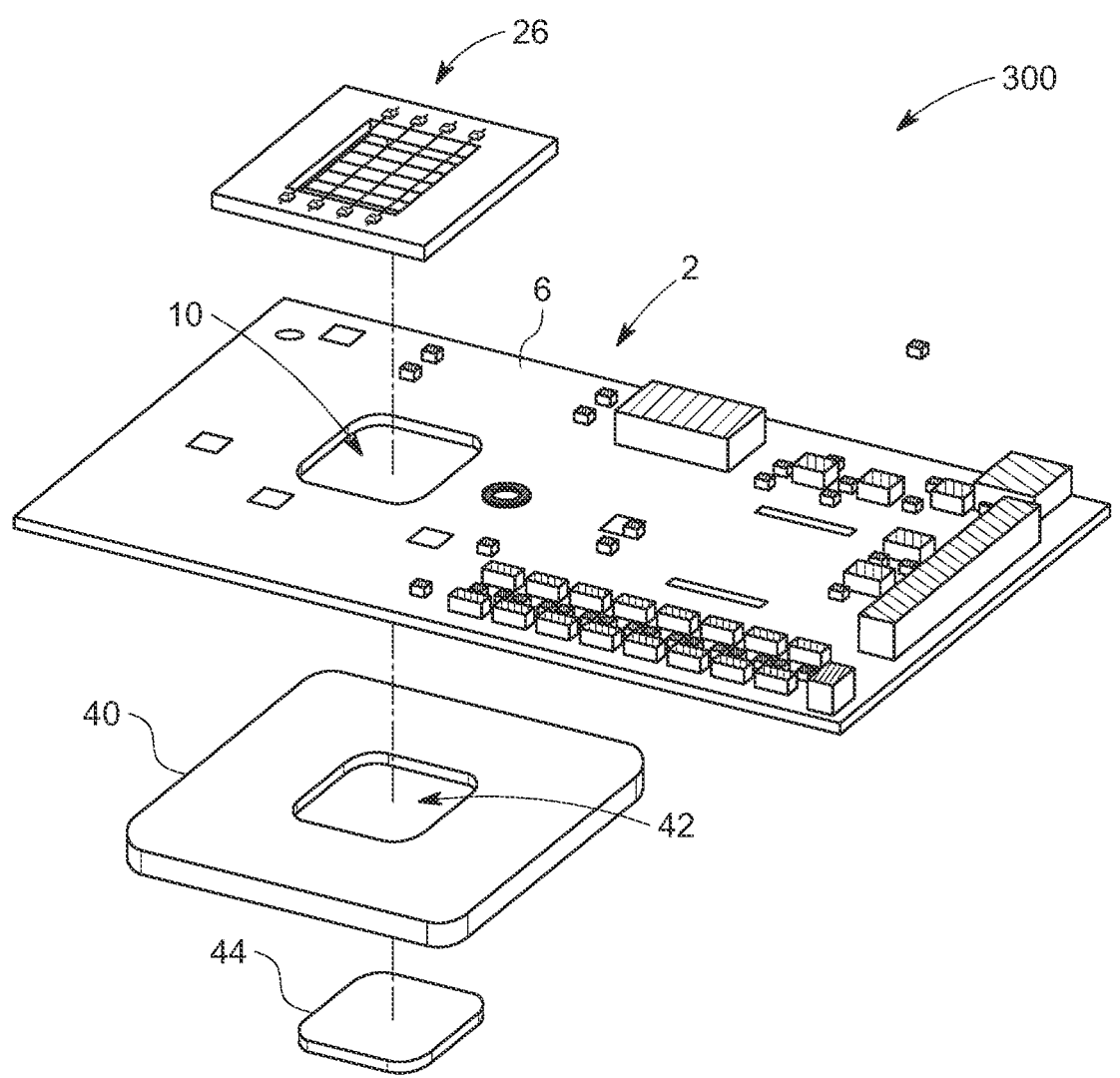
FIG. 7 is an exploded view of an integrated ionic air mover with coil.
Figure 8:
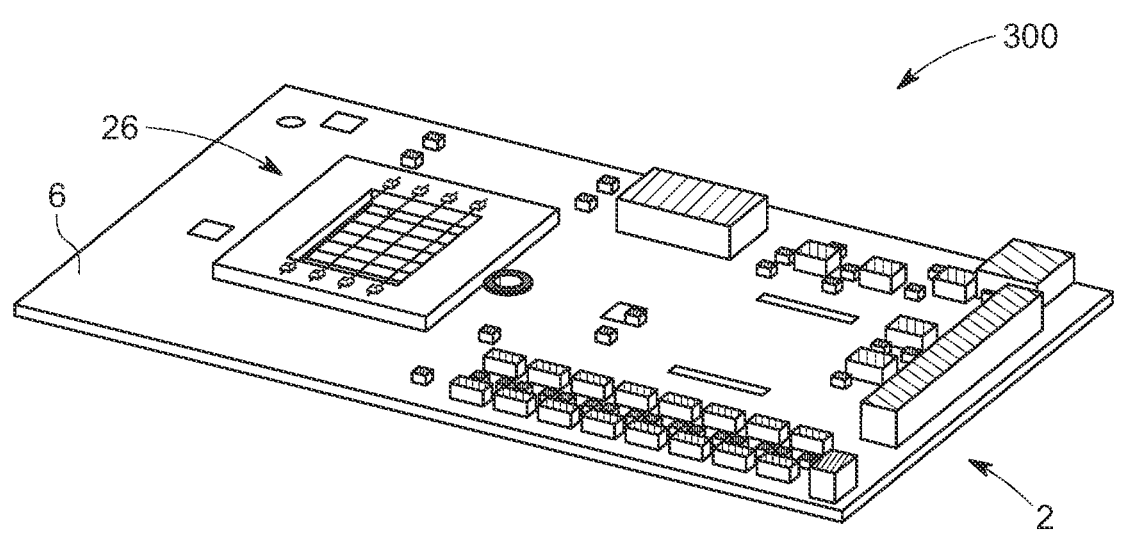
FIG. 8 is a top perspective view of the integrated ionic air mover with coil of FIG. 7.
Figure 9:
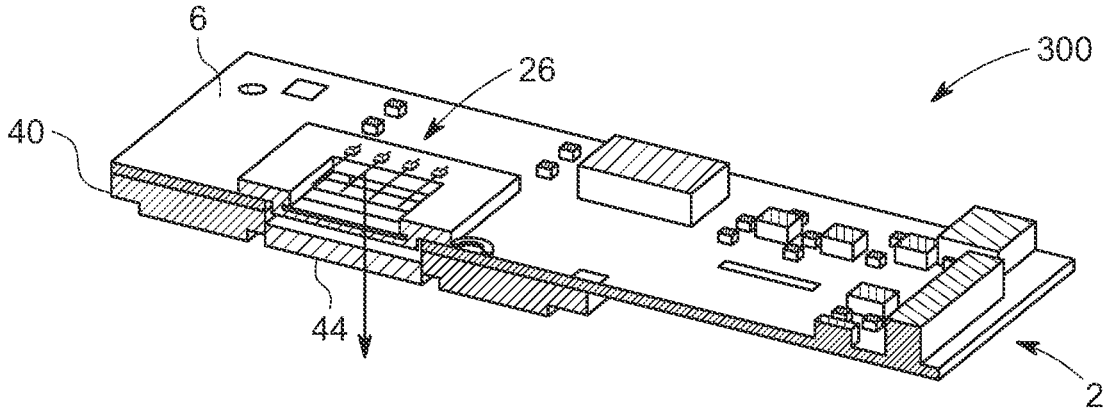
FIG. 9 is a cross sectional perspective view of the integrated ionic air mover with coil of FIG. 8.
Figure 10:
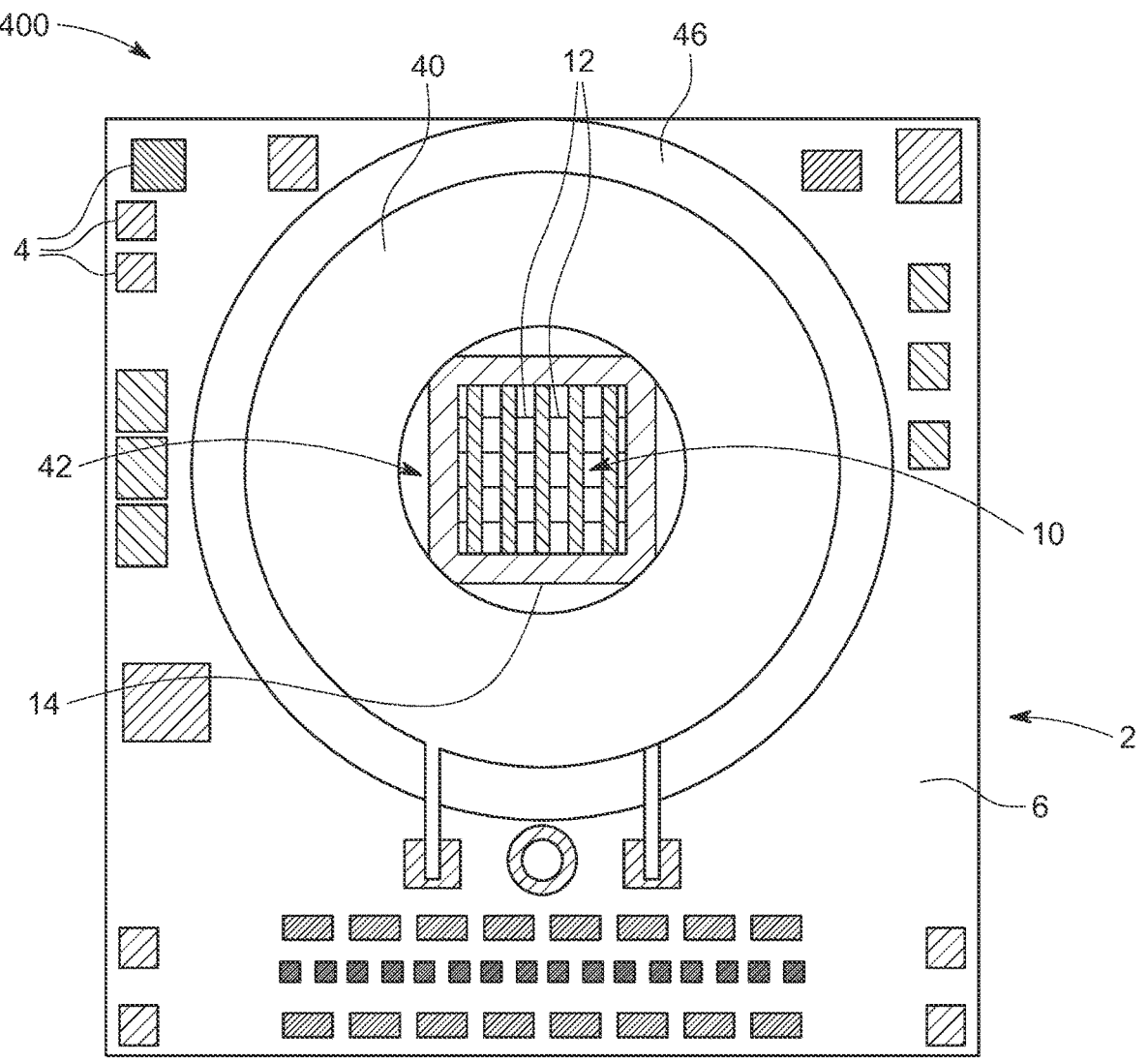
FIG. 10 is an exploded view of a self-cooling wireless charging assembly.
Figure 11:
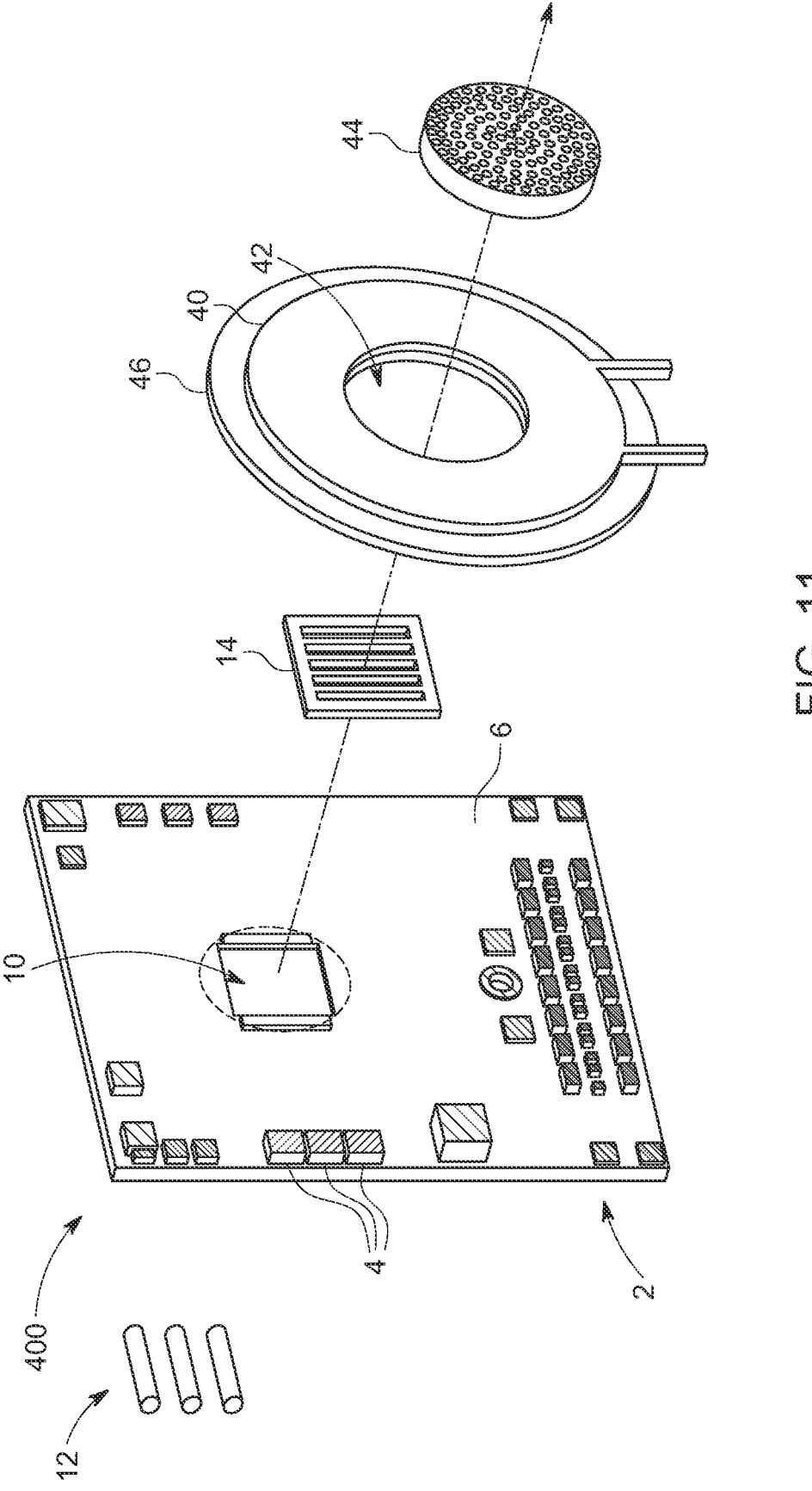
FIG. 11 is a top view of the self-cooling wireless charging assembly of FIG. 10.
Figure 12:
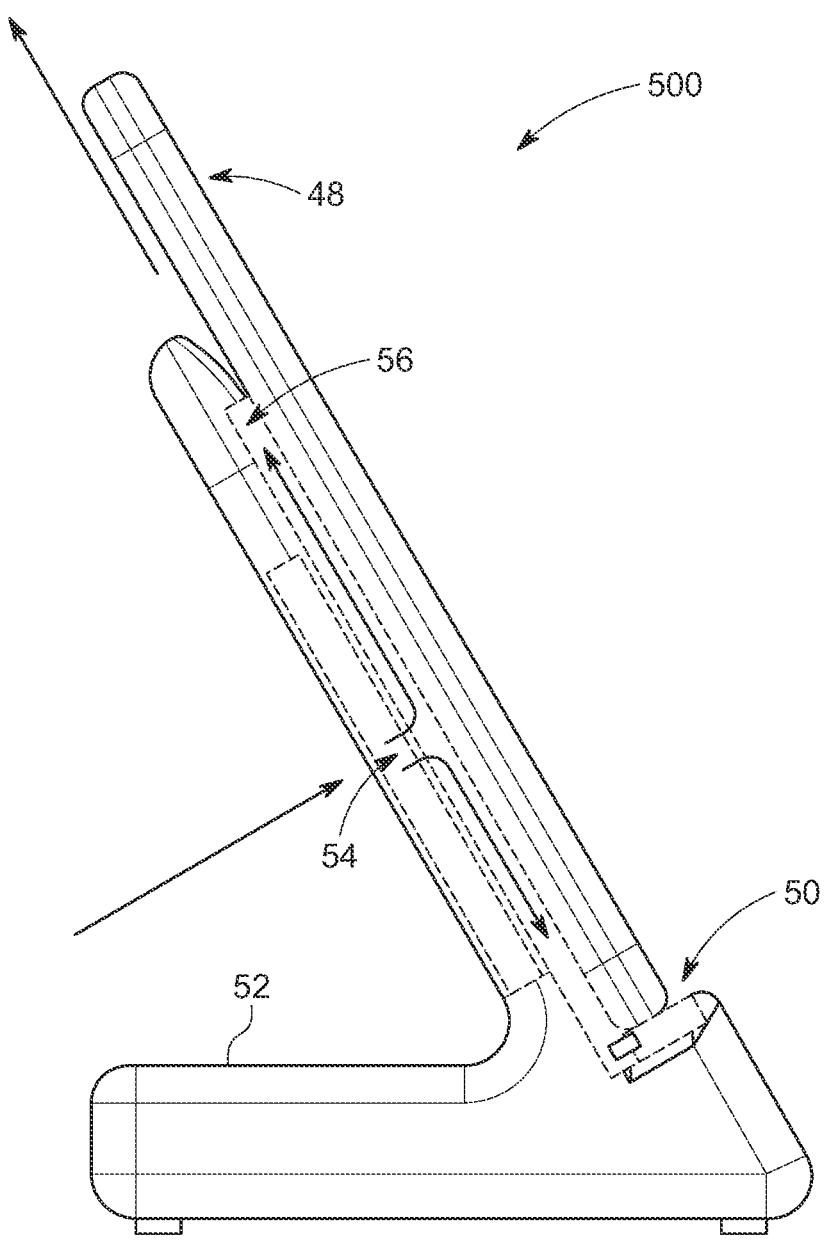
FIG. 12 is a side view of a self-cooling wireless charging cradle apparatus with a charging device.

The embodiments of FIGS. 7-9 show an integrated ionic air mover with a coil 300. FIGS. 10-11 show a self-cooling wireless charging assembly 400, and FIG. 12 illustrates how the self-cooling wireless charging assembly 400 may be used as part of a self-cooling wireless charging cradle apparatus 500.

In these embodiments, a transmitter coil 40 is integrated for use in devices charged wirelessly. The transmitter coil 40 is equivalent to the primarily coil of a transformer, while the coil inside the chargeable device 48 is equivalent to the secondary coil of a transformer. Together, they create a transformer which allows the charger's primary coil to transfer energy to the secondary coil of the device (such as a phone). Major sources of heat in systems that use charging coils are the losses in the coils, or Joule heating, due to eddy currents in the shielding material, and any metallic components that are in the path of the magnetic flux lines between the coils. Switching losses in the power converters on both sides, as well as losses in passive components such as rectifiers further add to the heat generated.

It should be noted that the heat is generated by both the transmitter system and the receiver system, and the transmitter side is thermally coupled to the receiver via a combination of conduction and convention. These heat sources are additive to the heat generated by charging of the Li-ion battery. Thus, there is a thermal coupling of the charger and chargeable device, and heat generated by the charger can be transferred to the chargeable device and vice versa. Accordingly, cooling the charger can reduce the heat generated in the chargeable device, by acting as a heat sink.

The proximity of the receiver coil to the battery can add to the stress of the thermal management system. The battery, typically Li-ion based is considered to operate safely during its charging and discharging mode at a temperature below 45° C. Above that temperature, the battery health deteriorates quickly and there is risk of thermal runaway, resulting in catastrophic failure of the battery.

In wired charging, the battery heat generally dissipates from the back side of the chargeable device (such as the back side of a phone). However, during wireless charging, there is an additional heat sources (i.e., the secondary, or receiver coil) present inside the device, which also obstructs the heat flow from the battery. In addition, oftentimes the entire phone is resting on the primary (or transmitter) coil, which itself is a heat source. Hence, at high temperatures, in the proximity of so many heat sources, the battery can overheat. To maintain battery health, the wireless charge rate must be throttled such that the battery remains under its safe operating temperature. In other words, higher temperatures mean longer charging times, and lower temperatures mean faster charging times.

Referring to FIGS. 7-9, an ionic air mover assembly 26 is placed on top of a PCB 2. In addition to the components previously described in FIGS. 4-6, in FIGS. 7-9 a transmitter coil 40 is included and in operable connection with the PCB 2. The transmitter coil 40 has a transmitter coil aperture 42. The transmitter coil 40 may be mounted to either the first (top) side 6 or the second (bottom) side of the PCB 2. The transmitter coil 40 is operable to generate magnetic flux to provide a wireless charge to a chargeable device. The transmitter coil aperture 42 is positioned near the center of the transmitter coil 40 and the transmitter coil aperture is substantially aligned with the PCB opening 10. As previously described, an ozone catalyst member 44 may be integrated with PCB 2 to remove ozone in the system. Also as previously described, the openings in the ionic mover assembly 26, PCB 2, and now the transmitter coil 40, are sized, shaped, and positioned to allow for air flow to pass from one side of the PCB 2 to the other side of the PCB 2, thereby cooling any components the air mover without any moving parts.

Referring to FIGS. 10 and 11, illustrations of a self-cooling wireless charging assembly 400 are shown according to the present invention. The assembly 400 includes a transmitter coil 40 mounted on a PCB 2. The transmitter coil 40 produces magnetic flux which induces current in the receiver coil of a chargeable device 48 (FIG. 12). The transmitter coil 40 may further comprise a magnetically conductive ferrite material 46 with high permittivity (e.g. ferrite, nano-crystalline ferrite or other similar materials) to manage the magnetic flux lines. The transmitter 40 is typically circular or ring shaped, and has an aperture 42 near its center. However, it may be possible to use other shapes with a comparable aperture generally at its center, without departing from the spirit of the invention.

The ionic air mover can be integrated with the PCB 2 and aligned with the PCB opening 10, and is generally aligned with the transmitter coil aperture 42. The ionic air mover, via a corona discharge created by a voltage differential, pulls air from one side of the PCB 2 through to the transmitter coil 40 and through the transmitter coil aperture 42. Alternatively, air could be pulled through the transmitter coil aperture 42 and pushed through the PCB 2. The resulting air flow around transmitter coil 40 will cool the transmitter coil 40 as well as other electronic components 4 in the vicinity. In particular, when the resultant air flow is pushed through transmitter coil aperture 42, it can be further directed onto the chargeable device 48, as will be described in more detail with reference to FIG. 12, to assist in its cooling.

By cooling both the transmitter coil 40 and the chargeable device 48, the rate of charging can be increased. The ionic air mover may be on constantly, or may turn on when a particular temperature threshold is detected using controllers and sensors well known in the art. Referring now FIG. 11, there is shown an exploded view of the self-cooling wireless charging assembly 400 of FIG. 10. The ionic air mover is comprised of an emitter (emitter wires) 12 generally mounted on side of the PCB 2, and collector wires 14 mounted on the other side of the PCB 2, such that when a high differential voltage is applied to emitter wires 12, air particles around emitter wires 12 are ionized. These positively charged ions move under the electric field from the positively charged emitter wires 12 to collector wires 14 creating the air flow (shown as a directional arrow through the center of components in FIG. 11), which cools the transmitter coil 40 through convection.

While air flow is generally shown passing through transmitter coil aperture 42, portions of the airflow may also be deflected and effect cooling of the adjacent electronic components 4.

Further, characteristics of the ionic air mover can be monitored, such as current, voltage, and electric charge and when particular thresholds are detected, such as reduced current or decreased voltage, indicating a build-up of contaminants on the collector. An intentional arc can be generated to clean built up contaminants from the collector wires as previously described. While in a preferred embodiment the ionic air mover is comprised of emitter wires 12 affixed to one of side of the PCB 2, and collector wires 14 are mounted on the other of side of the PCB 2, in order to draw air through the PCB, the ionic air mover may also be a discrete component mounted on either side of the PCB, or within the PCB opening 10.

As described above, an ozone catalyst member 44 may be used to reduce and mitigate ozone in the system.

Referring now to FIG. 12, there is illustrated a self-cooling wireless charging cradle apparatus 500 for wirelessly charging a chargeable device 48, such as a mobile phone incorporating wireless charging technology, incorporating the self-cooling wireless charging assembly 400 of FIGS. 10-11. It should be readily apparent to one skilled in the art that the same technology can be incorporated into any type of wireless charger, such as ear buds, toys, tablets, and the like.

The self-cooling wireless charging cradle apparatus 500 includes a housing 52, a cradle 50, a cradle aperture 54, and at least one channel 56. The self-cooling wireless charging assembly 400 (not shown in FIG. 12, because it is internal with respect to the self-cooling wireless charging cradle 52), creates an air flow (shown by directional arrows) to the back of the chargeable device 48, by expelling air from the ionic air mover through a cradle aperture 54. The air flow may move across the back of the chargeable device 48 via air channels 56 positioned within the cradle 50. Multiple channels may be included that provide a path for air flow to be directed along the chargeable device 48 to promote faster charging.

Other embodiments include methods of manufacturing the above described ionic air movers. In one embodiment, a method of manufacturing an integrated ionic air mover on a PCB comprises the following steps: providing an insulative substrate; forming a printed circuit on a printed circuit surface of the insulative substrate to form a PCB having a first side and a second side; forming a PCB opening on the PCB, the PCB opening traversing from the first side to the second side; forming an emitter mounted on the first side of the PCB, the emitter positioned across the PCB opening on the first side of the PCB; and, forming a collector mounted on the second side of the PCB, the collector positioned across the PCB opening second side of the PCB. The method may include the formation, positioning, affixing of any of the parts of the embodiments previously described.

Another embodiment includes a method of manufacturing a PCB surface mounted ionic air mover comprising the steps of: providing an insulative substrate; forming a printed circuit on a printed circuit surface of the insulative substrate to form a PCB having a first side and second side; forming a PCB opening on the PCB, the PCB opening traversing from the first side to the second side; forming an ionic air mover assembly for mounting over the PCB opening, the assembly having a first side, a second side, and an assembly opening; forming an emitter mounted on the first side of the assembly, the emitter positioned across the assembly opening on the first side of the assembly; forming a collector mounted on the second side of the assembly, the collector positioned across the assembly opening on the second side of the assembly; aligning the PCB opening with assembly opening; and, affixing the assembly to the PCB. The method may include the formation, positioning, and affixing of any of the parts of the embodiments previously described. Other general methods of producing printed circuit boards have been described, such as U.S. Pat. No. 5,210,940 to Kawakami et al., and U.S. Pat. No. 6,900,077 to Akram, the contents of each incorporated by reference in their entireties for all purposes.

Variations of the type, form, size, and material of any of emitter, collector, PCB may be of any of those described previously and used in any of the method described.

REFERENCE NUMBERS

The following reference numbers are used throughout FIGS. 1-12:

100 Integrated ionic air mover
200 PCB surface mounted ionic air mover
300 Integrated ionic air mover with coil
400 Self-cooling wireless charging assembly
500 Self-cooling wireless charging cradle apparatus

2 Printed circuit board
4 Electric components
6 First (top) side of PCB
8 Second (bottom) side of PCB
10 PCB opening
12 Emitter (anode)
14 Collector (collector wires/cathode)
16*a* First conductive endplate of emitter
16*b* second conductive endplate of emitter
18 PCB wire (or layer)
20 Power supply
22*a* Collector first plate
22*b* Collector second plate
24 Ground wire
26 Ionic air mover assembly
28 First side of ionic air mover assembly
30 Second side of ionic air mover assembly
32 Ionic air mover assembly opening
34 PCB attachment member
36 Ionic air mover assembly attachment member
38 Outer edge of the ionic air mover assembly
40 Transmitter coil
42 Transmitter coil aperture
44 Ozone catalyst member
46 Ferrite material
48 Chargeable device
50 Cradle
52 Housing
54 Cradle aperture
56 Channel While the invention has been described in terms of exemplary embodiments, it is to be understood that the words that have been used are words of description and not of limitation. As is understood by persons of ordinary skill in the art, a variety of modifications can be made without departing from the scope of the invention defined by the following claims, which should be given their fullest, fair scope.

What is claimed is:

1. An integrated ionic air mover comprising:
   a) a printed circuit board (PCB) for mounting electronic components, the PCB having:
      i) a first side and a second side,
      ii) a PCB opening traversing from the first side to the second side of the PCB, the PCB opening for allowing air to pass through the PCB, wherein the PCB opening is characterized as having a length, a width, and a height;
   b) an emitter mounted on the first side of the PCB, the emitter positioned across the PCB opening on the first side of the PCB; and,
   c) a collector mounted on the second side of the PCB, the collector positioned across the PCB opening on the second side of the PCB,
   wherein the collector and emitter are mounted on opposite sides of the PCB, and wherein the emitter and the collector are oriented such that when a sufficient differential voltage is applied to the emitter and the collector, air is ionized to produce an airflow through the PCB opening, thereby cooling electronic components mounted on or near the PCB.

2. The integrated ionic air mover of claim 1, wherein the collector is characterized as having a longitudinal axis, and the emitter is characterized as having a longitudinal axis, wherein the longitudinal axis of the collector and the longitudinal axis of the emitter are substantially perpendicular to each other and consistently spaced from each other.

3. The integrated ionic air mover of claim 1, wherein the collector is a plurality of collector wires.

4. The integrated ionic air mover of claim 3, wherein at least one of the plurality of collector wires has a diameter between 0.1 mm and 2.0 mm, and the plurality of collector wires are free of sharp edges in proximity to the emitter, thereby reducing arcing when there is an electric field present between the emitter and the collector; and, wherein the emitter is a wire having a diameter between 20 microns and 100 microns.

5. The integrated ionic air mover of claim 1, wherein the collector is a stainless-steel wire having a diameter larger than a diameter of the emitter.

6. The integrated ionic air mover of claim 1, wherein the emitter is a plurality of emitter wires.

7. The integrated ionic air mover of claim 1, wherein the PCB is a Flame Retardant-4 (FR-4) PCB, thereby allowing easy manufacturing of the integrated ionic air mover by leveraging worldwide preexisting FR-4 manufacturing infrastructure to create the integrated ionic air mover.

8. The integrated ionic air mover of claim 1, wherein the PCB further comprises:

a) a first conductive end plate and a second conductive end plate, the first and second conductive end plates positioned on opposing ends of the PCB opening, wherein the emitter connects the first conductive end plate to the second conductive end plate along the length of the PCB opening, and wherein a PCB wire or a PCB layer connects the first conductive end plate to the second conductive end plate, the PCB wire or the PCB layer capable of carrying positive direct current (DC) bias; and, b) a first collector plate and a second collector plate, the first and second collector plates positioned on opposing ends of the PCB opening, wherein a plurality of collector wires connect the first collector plate to the second collector plate across a width of the PCB opening, and wherein the first and second plates are connected to each other via a ground wire.

9. The integrated ionic air mover of claim 1 further comprising:

a) a power supply, the power supply capable of providing high voltage power and current to the emitter, the power supply having a microprocessor capable of adjusting voltage and current in response to a measured predetermined characteristic, b) a controller capable of turning on or off the ionic air mover in response to the measured predetermined characteristic.

10. The integrated ionic air mover of claim 9, wherein the measured predetermined characteristic is at least one of temperature, impedance, detection of an electrical short, and duration of operation.

11. The integrated ionic air mover of claim 9, wherein predetermined characteristic a temperature of electronic components on the PCB, the controller capable of turning on or off the integrated ionic air mover when a threshold temperature has been detected.

12. The integrated ionic air mover of claim 1, further comprising a transmitter coil mounted on at least one of the first side and the second side of the PCB operable to generate magnetic flux to provide a wireless charge, the transmitter coil having a transmitter coil aperture positioned near a center of the transmitter coil, and wherein the transmitter coil aperture is substantially aligned with the PCB opening.

13. The integrated ionic air mover of claim 12, wherein the airflow is directed through the transmitter coil aperture.

14. The integrated ionic air mover of claim 13 wherein the transmitter coil further comprises a magnetically conductive ferrite material for managing magnetic flux lines.

15. A printed circuit board (PCB) mounted ionic air mover comprising:

a) an ionic air mover assembly for mounting over a PCB opening on a PCB, the assembly having:

i) a first side and a second side, ii) an assembly opening characterized as having a length, a width, and a height, the assembly opening traversing from the first side to the second side of the ionic air mover assembly, the assembly opening sized to allow air to pass through the assembly opening from the first side to the second side;

b) an emitter mounted on the first side of the assembly, the emitter positioned across the assembly opening on the first side;

c) a collector mounted on the second side of the assembly, the collector positioned across the assembly opening on the second side of the assembly; and, d) a PCB attachment member affixed to at least one of the first side and the second side of the assembly, the PCB attachment member configured to mount the ionic air mover over the PCB opening on the PCB, wherein the emitter and the collector are oriented and positioned such that when the ionic air mover is mounted over the PCB opening on the PCB, the emitter and the collector are on opposite sides of the PCB, and when a sufficient differential voltage is applied to the emitter and the collector, air is ionized to produce an airflow through the assembly opening from the first side to the second side, and wherein the airflow is capable of passing through the PCB opening on the PCB.

16. The PCB mounted ionic air mover of claim 15, wherein the PCB attachment member is a solder pad for affixing the assembly to a PCB surface.

17. The PCB mounted ionic air mover of claim 16, wherein the PCB attachment member is at least two PCB attachment members;

wherein the assembly is substantially rectangularly shaped; and, wherein the at least two PCB attachment members are affixed in proximity to outer edges of the assembly.

18. The PCB mounted ionic air mover of claim 15, further comprising a PCB having a PCB opening, wherein the assembly opening is sized and shaped to align with the PCB opening, thereby allowing air to pass through the assembly opening and the PCB opening.

19. The PCB mounted ionic air mover of claim 18, further comprising an ozone catalyst member, wherein the ozone catalyst member is affixed to the PCB, the ozone catalyst member operable to mitigate ozone generated by the ionic air mover.

20. A method of manufacturing an integrated ionic air mover on a printed circuit board (PCB) comprising the steps of:

a) providing an insulative substrate;

b) forming a printed circuit on a printed circuit surface of the insulative substrate to form a PCB having a first side and a second side;

c) forming a PCB opening on the PCB, the PCB opening traversing from the first side to the second side;

d) forming an emitter mounted on the first side of the PCB, the emitter positioned across the PCB opening on the first side of the PCB; and, e) forming a collector mounted on the second side of the PCB, the collector positioned across the PCB opening on the second side of the PCB.

21. The method of claim 20, wherein the collector is characterized as having a longitudinal axis, and the emitter is characterized as having a longitudinal axis, wherein the longitudinal axis of the collector and the longitudinal axis of the emitter are substantially perpendicular to each other.

22. The method of claim 21, wherein the collector is at least one wire having a cross sectional diameter between 0.1 mm and 2.0 mm, and is free of sharp edges in proximity to the emitter, thereby reducing arcing when there is an electric field present between the emitter and the collector, and where the emitter is at least one wire having a diameter between 20 microns and 100 microns.

23. The method of claim 20, wherein the PCB is a Flame Retardant-4 (FR-4) PCB, thereby allowing easy manufacturing of the integrated ionic air mover by leveraging worldwide preexisting FR-4 manufacturing infrastructure to create the integrated ionic air mover.

24. The method of claim 20, wherein the PCB further comprises:

a) a first conductive end plate and a second conductive end plate, the first and second conductive end plates positioned on opposing ends of the PCB opening, wherein the emitter connects the first conductive end plate to the second conductive end plate along a length of the PCB opening, and wherein a PCB wire or a PCB layer connects the first conductive end plate to the second conductive end plate, the PCB wire or the PCB layer capable of carrying positive direct current (DC) bias; and, b) a power supply electrically connected to the PCB wire or PCB layer, the power supply capable of providing a high voltage and current to the emitter.

25. The method of claim 20, further comprising the step of providing a power supply operably connected to the PCB, the power supply having a microprocessor capable of adjusting voltage and current in response to a measured predetermined characteristic.

26. The method of claim 25, wherein the measured predetermined characteristic is at least one of temperature, impedance, detection of an electrical short, and duration of operation.

27. A method of manufacturing a printed circuit board (PCB) surface mounted ionic air mover comprising the steps of:

a) providing an insulative substrate;

b) forming a printed circuit on a printed circuit surface of the insulative substrate to form a PCB having a first side and second side;

c) forming a PCB opening on the PCB, the PCB opening traversing from the first side to the second side;

d) forming an ionic air mover assembly for mounting over the PCB opening, the assembly having a first side, a second side, and an assembly opening;

e) forming an emitter mounted on the first side of the assembly, the emitter positioned across the assembly opening on the first side of the assembly;

f) forming a collector mounted on the second side of the assembly, the collector positioned across the assembly opening on the second side of the assembly;

g) aligning the PCB opening with assembly opening; and, h) affixing the assembly to the PCB.

28. The method of claim 27, wherein the collector is characterized as having a longitudinal axis, and the emitter is characterized as having a longitudinal axis, wherein the longitudinal axis of the collector and the longitudinal axis of the emitter are substantially perpendicular to each other.

29. The method of claim 27, wherein the collector is at least one wire having a cross sectional diameter between 0.1 mm and 2.0 mm, and the at least one wire is free of sharp edges in proximity to the emitter, thereby reducing arcing when there is an electric field present between the emitter and the collector, and wherein the emitter is a wire having a cross sectional diameter between 20 microns and 100 microns.

30. The method of claim 27, wherein the PCB is a Flame Retardant-4 (FR-4) PCB, thereby allowing easy manufacturing of an ionic air mover by leveraging worldwide preexisting FR-4 manufacturing infrastructure to create the PCB.

31. The method of claim 27, wherein the PCB further comprises:

a) a first conductive end plate and a second conductive end plate, the first and second conductive end plates positioned on opposing ends of the PCB opening, wherein the emitter connects the first conductive end plate to the second conductive end plate along a length of the PCB opening, and wherein a PCB wire or a PCB layer connects the first conductive end plate to the second conductive end plate, the PCB wire or the PCB layer capable of carrying positive direct current (DC) bias; and, b) a power supply electrically connected to the PCB wire or PCB layer, the power supply capable of providing a high voltage and current to the emitter.

32. The method of claim 27, further comprising the step of providing a power supply operably connected to the PCB, the power supply having a microprocessor capable of adjusting voltage and current in response to a measured predetermined characteristic.

33. A self-cooling wireless charging cradle apparatus comprising:

a) a housing;

b) a cradle operable to receive a wirelessly chargeable device;

c) a printed circuit board (PCB) having, i) a first side and a second side, and ii) a PCB opening traversing from the first side to the second side of the PCB, the sized to allow air to pass through the PCB, wherein the PCB opening is characterized as having a length, a width, and a height;

d) a transmitter coil mounted on one side of the PCB, the transmitter coil operable to generate a magnetic flux for charging a wirelessly chargeable device mounted in the cradle, the transmitter coil having a transmitter coil aperture positioned near a center of the transmitter coil, and wherein the transmitter coil aperture is substantially aligned with the PCB opening; and, e) an ionic air mover substantially aligned with the PCB opening, the ionic air mover having at least one emitter and at least one collector spaced apart such that when a differential voltage is applied to the at least one emitter, ionized air moves from the at least one emitter towards the at least one collector, thereby generating an airflow for drawing air through the PCB opening to cool the transmitter coil.

34. The self-cooling wireless charging cradle apparatus of claim 33, further comprising a cradle aperture in the cradle operable to direct the airflow onto a chargeable device.

35. The self-cooling wireless charging cradle apparatus of claim 34, further comprising at least one channel disposed within the cradle for directing the airflow onto a surface of the chargeable device.

\* \* \* \* \*